United States Patent
Oida et al.

(10) Patent No.: US 7,148,529 B2
(45) Date of Patent: Dec. 12, 2006

(54) SEMICONDUCTOR PACKAGE

(75) Inventors: Mitsuru Oida, Kanagawa-ken (JP); Masatoshi Fukuda, Kanagawa-ken (JP); Yasuhiro Koshio, Kanagawa-ken (JP); Hiroshi Funakura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,108

(22) Filed: Mar. 20, 2002

(65) Prior Publication Data

US 2002/0140062 A1  Oct. 3, 2002

(30) Foreign Application Priority Data

Mar. 30, 2001  (JP) ............................ P2001-102061

(51) Int. Cl.
  *H01L 31/72* (2006.01)
  *H01L 27/15* (2006.01)
  *H01L 29/788* (2006.01)
  *H01L 31/232* (2006.01)
  *H01L 29/40* (2006.01)

(52) U.S. Cl. .......................... 257/294; 257/13; 257/21; 257/79; 257/82; 257/323; 257/414; 257/431; 257/432; 257/778; 257/782; 257/784

(58) Field of Classification Search ................ 257/778, 257/666
  See application file for complete search history.

(56) References Cited

U.S. PATENT DOCUMENTS

| 4,418,284 | A | * | 11/1983 | Ogawa et al. ............... 156/263 |
| 5,130,832 | A | * | 7/1992 | Kawaguchi et al. ........ 349/151 |
| 5,317,195 | A | | 5/1994 | Ishikawa et al. |
| 5,394,014 | A | | 2/1995 | Ishikawa et al. |
| 5,436,203 | A | * | 7/1995 | Lin .............................. 29/841 |
| 5,625,224 | A | * | 4/1997 | Greenwood et al. ......... 257/698 |
| 5,898,217 | A | * | 4/1999 | Johnston ...................... 257/691 |
| 6,040,200 | A | | 3/2000 | Hayashi et al. |
| 6,054,774 | A | * | 4/2000 | Ohmori et al. .............. 257/786 |
| 6,172,732 | B1 | * | 1/2001 | Hayakawa et al. .......... 349/152 |
| 6,229,217 | B1 | * | 5/2001 | Fukui et al. ................. 257/685 |
| 6,249,044 | B1 | | 6/2001 | Kao et al. |
| 6,270,193 | B1 | * | 8/2001 | Hiwada ........................ 347/50 |
| 6,281,027 | B1 | * | 8/2001 | Wei et al. ...................... 438/14 |
| 6,406,941 | B1 | * | 6/2002 | Nakamura ................... 438/116 |
| 6,542,374 | B1 | * | 4/2003 | Muramatsu et al. ......... 361/760 |

(Continued)

FOREIGN PATENT DOCUMENTS

JP  55-68694  *  5/1980

(Continued)

OTHER PUBLICATIONS

Charles HArper, "Electronic Packaging and Interconnection Handbook", MCgraw-Hill Inc 1990, p. 10.3.*

(Continued)

*Primary Examiner*—Carl Whitehead, Jr.
*Assistant Examiner*—James M Mitchell
(74) *Attorney, Agent, or Firm*—Finnegan, Henderson, Farabow, Garrett & Dunner, L.L.P.

(57) ABSTRACT

A semiconductor package includes (a) an interposer, (b) a wiring layer containing conductors formed adjacent to each other at intervals that cause no short circuit among the conductors, the wiring layer covering a given area of the interposer, to block light from passing through the given area, (c) a light blocking layer covering a no-wiring area of the interposer not covered by the wiring layer, to block light from passing through the no-wiring area, (d) a semiconductor chip electrically connected to the wiring layer, and (e) a resin mold sealing the wiring layer, the light blocking layer, and the semiconductor chip.

11 Claims, 4 Drawing Sheets

U.S. PATENT DOCUMENTS

2001/0048064 A1*  12/2001  Kitani ..................... 250/208.1
2003/0006509 A1*   1/2003  Suzuki et al. ............... 257/778

FOREIGN PATENT DOCUMENTS

| | | | |
|---|---|---|---|
| JP | 58-127338 | | 7/1983 |
| JP | 358134449 | * | 8/1983 |
| JP | 361112322 | * | 5/1986 |
| JP | 261174763 | * | 8/1986 |
| JP | 63-306633 | * | 12/1988 |
| JP | 1-128534 | * | 5/1989 |
| JP | 05-21655 | | 1/1993 |
| JP | 5-90549 | | 4/1993 |
| JP | 6-29568 | | 2/1994 |
| JP | 6-112371 | | 4/1994 |
| JP | 6-132423 | | 5/1994 |
| JP | 6-143885 | | 5/1994 |
| JP | 9-307111 | | 11/1997 |
| JP | 11-214588 | | 8/1999 |
| JP | 11-297903 | * | 10/1999 |
| JP | 2000-277641 | | 10/2000 |
| JP | 2000-357759 | | 12/2000 |
| JP | 2000357759 | * | 12/2000 |
| KR | 1996-11642 | | 8/1996 |

OTHER PUBLICATIONS

U.S. Appl. No. 09/854,559, filed May 15, 2001, to Funakura et al.

Eiichi Hosomi et al., "Semiconductor Device Having Bump Electrodes and Method of Manufacturing the Same", U.S. Appl. No.: 09/813,160, filed Mar. 21, 2001.

Yasuhiro Koshio et al., "Semiconductor Device, External Connection Terminal Structural Member and Method of Manufacturing Semiconductor Device", U.S. Appl. No. 09/665,686 filed Sep. 20, 2000.

Search Report, issued by European Patent office, dated Apr. 4, 2005, for European Application No. 02251806.2-1235.

Notification of Reasons for Refusal from the Korean Intellectual Property Office, dated Jul. 22, 2005, in Patent Application No. 10-2002-0017070, and English translation thereof.

Notification of Reasons for Refusal issued by the Japanese Patent Office on Sep. 5, 2006, for Japanese Patent Application No. 2001-102061, and English-language translation thereof.

* cited by examiner

SEMICONDUCTOR PACKAGE

CROSS REFERENCE TO RELATED APPLICATIONS

This application is based upon and claims the benefit of priority from the prior Japanese Patent Application No. 2001-102061 filed on Mar. 30, 2001, the entire contents of which are incorporated herein by reference.

BACKGROUND OF THE INVENTION

1. Field of the Invention

The present invention relates to a semiconductor package, and particularly, to a technique of preventing the generation of leak current due to photoexcitation in a thin semiconductor package.

2. Description of the Related Art

An earlier semiconductor package is thinned by (1) thinning an interposer of the package and by (2) thinning a resin mold of the package. An example of a semiconductor package thinned by the techniques (1) and (2) is a Thin Quad Outline Nonleaded (TQON) package. The TQON package employs a flip-chip connection process and guarantees a package thickness of 0.5 mm or thinner.

FIG. 1 is a sectional view showing a semiconductor package according to a related art, and FIG. 2 is a plan view showing a wiring layer formed on an interposer of the package of FIG. 1.

In FIG. 1, the wiring layer 48 is formed on the interposer 40. A semiconductor chip 10 is mounted upside down and connected to the wiring layer 48 by flip-chip contacts 20. The interposer 40, the wiring layer 48, and the contacts 20 are sealed with an underfill material 30. The chip 10 and the underfill material 30 are sealed with a resin mold 60.

Under the chip 10, there are only the contacts 20 and there is no wiring layer 48.

In FIG. 2, the wiring layer 48 includes conductors that are spaced widely apart from one another.

The thin package according to the related art has a problem (1) that the interposer allows the transmission of light which optically excites semiconductor elements in the semiconductor chip and generates leakage current causing malfunctions. This is because, in order to thin the interposer, the related art fabricates the interposer from a resin substrate made of, for example, glass epoxy resin, Bismaleimide Triazine (BT) resin, or polyimide (PI) resin, instead of a metal lead frame. The related art also has a problem (2) that the resin mold on the semiconductor chip allows the transmission of light, in particular, light of 780 nm or longer in wavelength which optically excites the semiconductor elements and generates leakage current causing malfunctions. The problem (2) occurs when the resin mold on the semiconductor chip is excessively thinned to reduce the thickness of the package.

SUMMARY OF THE INVENTION

According to an embodiment of the present invention, a semiconductor package includes an interposer, a wiring layer formed on the interposer, a semiconductor chip electrically connected to the wiring layer, and a resin mold protecting the wiring layer and semiconductor chip. The wiring layer includes conductors formed adjacent to each other at intervals that cause no short circuit among the conductors. The package is provided with a light blocking layer formed in areas on the interposer where the conductors are not present.

DETAILED DESCRIPTION OF EMBODIMENTS

Figure 1:
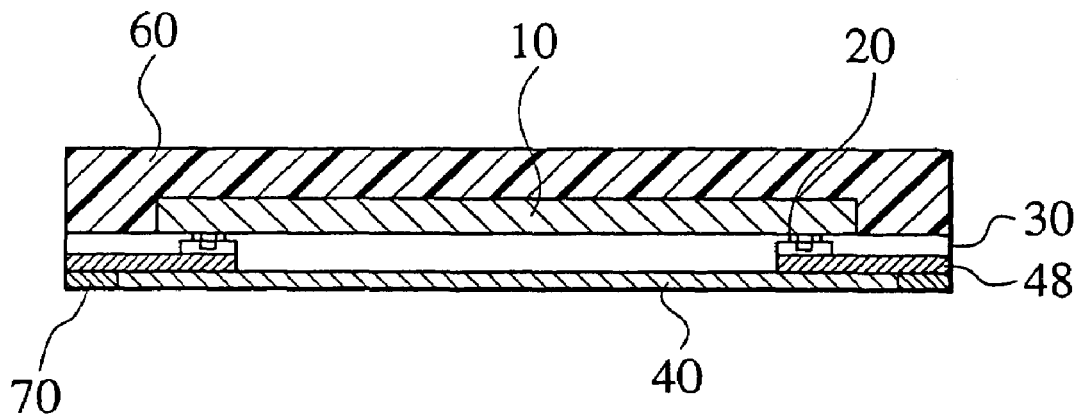
FIG. 1 is a sectional view showing a semiconductor package according to a related art.
Figure 2:
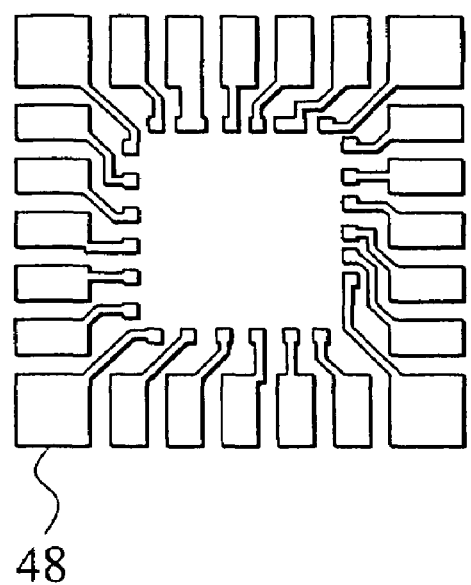
FIG. 2 is a plan view showing a wiring layer formed on an interposer in the package of FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 3:
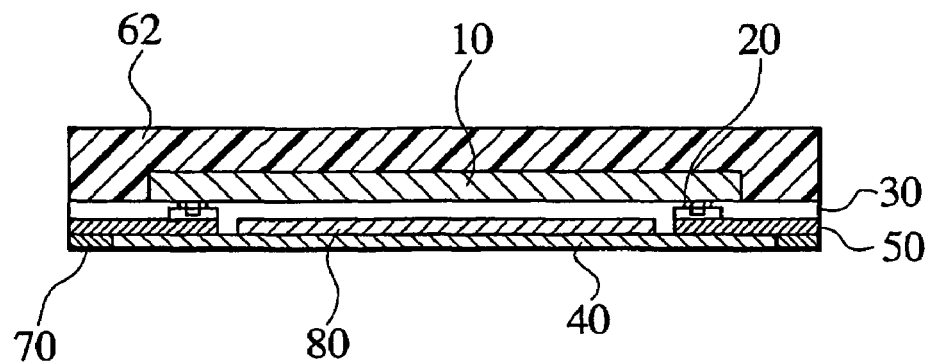
FIG. 3 is a sectional view showing a semiconductor package according to a first embodiment of the present invention.
Figure 4:
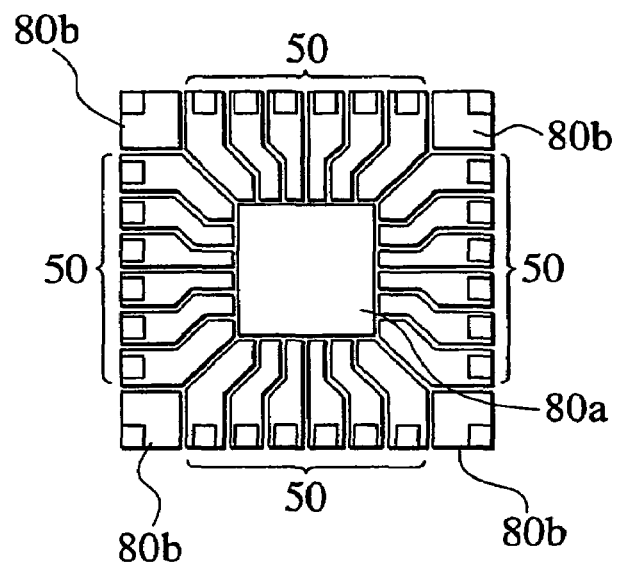
FIG. 4 is a plan view showing a wiring layer and light blocking layer formed on an interposer in the package of FIG. 3.

As shown in FIG. 3 and 4, the semiconductor package according to the first embodiment includes (a) an interposer 40, (b) a wiring layer 50 containing conductors formed adjacent to each other at intervals that cause no short circuit among the conductors, the wiring layer 50 covering a given area of the interposer 40, to block light from passing through the given area, (c) a light blocking layer 80 covering a no-wiring area of the interposer 40 not covered by the wiring layer 50, to block light from passing through the no-wiring area, (d) a semiconductor chip 10 electrically connected to the wiring layer 50, and (e) a resin mold 62 sealing the wiring layer 50, the light blocking layer 80, and the chip 10.

An underfill material 30 seals flip-chip contacts 20 that electrically connect the chip 10, which is mounted upside down, to the wiring layer 50. The underfill material 30 improves the connection reliability of the contacts 20.

The resin mold 62 may contain light blocking components such as carbon black powder and metal oxide powder. Even if the resin mold 62 is thinned to about 0.100 mm, the light blocking components in the resin mold 62 allow the transmittance of only about 0 to 1% of light of 780 nm or longer in wavelength.

The interposer 40 is made of, for example, organic material such as BT resin or PI resin.

The wiring layer 50 is made of light blocking conductive material such as copper (Cu), aluminum (Al), and copper-nickel (Cu—Ni) alloy. The wiring layer 50 electrically connects terminals of chip 10 to external terminals 70.

The light blocking layer 80 is formed where the wiring layer 50 is not present, for example, under the chip 10 and at the corners of the package. The light blocking layer 80 is made of light blocking material which may be conductive or nonconductive. Simultaneously forming the wiring layer 50 and light blocking layer 80 reduces the number of processes. In this regard, it is preferable to simultaneously form the light blocking layer 80 and wiring layer 50 from the same material.

In FIG. 4, the conductors in the wiring layer 50 cover a large part of the interposer 40 and are formed adjacent to each other at intervals that cause no short circuit among the conductors. To block natural light from passing through gaps between the conductors, the interval between the conductors must be in the range of, for example, 0.010 to 0.100 mm. To prevent short circuit, wider intervals are preferred between the conductors. Wider intervals, however, increase the risk of light permeation. Depending on the environment of use of semiconductor package according to the embodiment, the light wavelengths that must be blocked vary, and depending on the light wavelengths to be blocked, the adequate interval changes. According to the first embodiment, an interval between adjacent conductors in the wiring layer 50 is, for example, about 0.050 mm.

According to the embodiment, the light blocking layer 80 consists of a light blocking layer 80a and light blocking layers 80b formed where no wiring layer is present, i.e., under the chip 10 and at the corners of the package.

A technique of simultaneously forming the wiring layer 50 and light blocking layer 80 on the interposer 40 will be explained. The interposer 40 is made of a polyimide tape in this example.

(1) A thin copper film is entirely formed on the surface of the polyimide tape where the wiring layer, etc., are formed.

(2) A photoresist layer is entirely formed on the thin copper film.

(3) A mask to form the wiring layer and light blocking layer is set on the photoresist layer and is exposed to light such as ultraviolet rays, electron beams, or ion beams.

The photoresist layer may be made of a resin that melts when exposed to light. In this case, the mask is shaped to be identical with the wiring layer 50 and light blocking layers 80a and 80b, so that gaps in the mask may correspond to the gaps separating the conductors in the wiring layer and the light blocking layers from one another. The photoresist layer is exposed to the light through the gaps in the mask.

The photoresist layer may be made of a resin that hardens when exposed to light. In this case, the mask is shaped to be identical with the gaps that separate the conductors and light blocking layers from one another, so that gaps in the mask may correspond to the conductors and the light blocking layers. The photoresist layer is exposed to the light through the gaps in the mask.

(4) A developer is applied to remove unnecessary parts from the photoresist layer. If the photoresist layer is made of resin that melts by exposure, the patterns left on the photoresist layer after the development coincide with the shape of the mask. If the photoresist layer is made of resin that hardens by exposure, the patterns left on the photoresist layer after the development coincide with a negative-positive inverted shape of the mask.

(5) An etching process is carried out to remove copper at parts not protected by the photoresist layer. As a result, only the parts of the copper thin film protected by the photoresist layer remain on the polyimide tape.

(6) The photoresist layer is removed, to leave the wiring layer 50 and light blocking layer 80 on the polyimide tape.

On the wiring layer 50, the semiconductor chip 10 is set in an upside-down configuration, and the wiring layer 50 and chip 10 are connected to each other by the contacts 20. The chip 10 and wiring layer 50 are sealed with the resin mold 62, to complete the semiconductor package.

As explained above, the semiconductor package according to the first embodiment differs from the related art in that the conductors in the wiring layer 50 are arranged adjacent to each other at intervals that cause no short circuit among the conductors and in that the light blocking layer 80 is added. The conductors are arranged adjacent to each other at intervals as close as possible without causing short circuit among the conductors, in order to prevent light from passing through gaps between the conductors. The light blocking layer 80 formed in areas where there is no wiring layer prevents light from reaching the semiconductor chip 10 through the no-wiring area.

The semiconductor package according to the first embodiment differs from the related art in that the resin mold 62 contains light blocking components. Adding light blocking components to the resin mold 62 prevents light from passing through the resin mold 62 even if the resin mold 62 is thin.

Blocking light from reaching the semiconductor chip 10 prevents semiconductor elements in the chip 10 from being optically excited to generate leakage current, thereby preventing the malfunctions of the elements.

(Second Embodiment)

Figure 5:
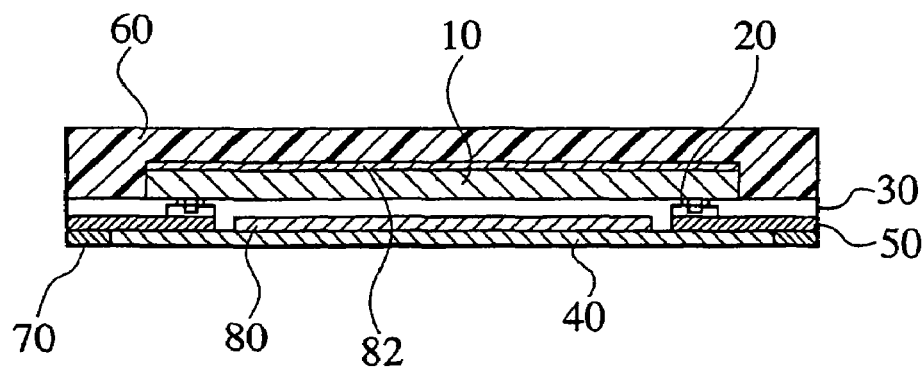
FIG. 5 is a sectional view showing a semiconductor package according to a second embodiment of the present invention.

Only a differences in the second embodiment from the first embodiment will be explained. According to the semiconductor package of the second embodiment as shown in FIG. 5, a resin mold 60 contains no light blocking components. Instead, a light blocking layer 82 is formed on the semiconductor chip 10.

The light blocking layer 82 is formed by, for example, a sputter deposition method or an electroless plating method, to have a thickness in the range of, for example, 100 to 10000 angstroms. The light blocking layer 82 may contain, for example, gold (Au), nickel (Ni), or carbon (C).

The resin mold 60 according to the second embodiment contains no light blocking components, and therefore, is unable to block light. To cope with this, the second embodiment forms the light blocking layer 82 on the chip 10, to block light passing through the resin mold 60 from reaching the chip 10.

Like the first embodiment, the second embodiment forms a light blocking layer 80 between the chip 10 and an interposer 40, to prevent light passing through the interposer 40 from reaching the chip 10.

FIG. 6A to 6F are plan views showing various shapes of wiring layers and light blocking layers on interposers in semiconductor packages formed according to the first or second embodiments. In FIGS. 6A to 6F, a numeral 20 is a flip-chip contact, 50 is a wiring layer, 70 is an external connection terminal, and 80 is a light blocking layer.

Figure 6A:
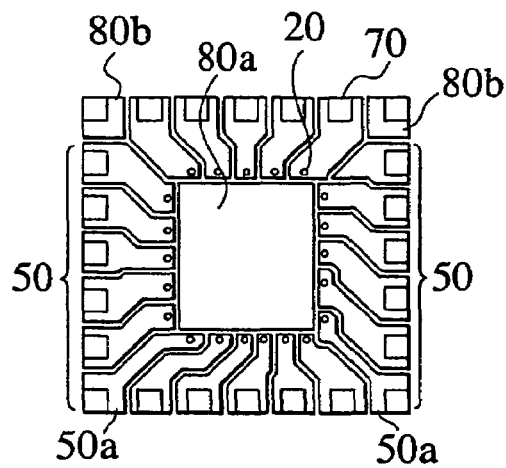
FIGS. 6A to 6F are plan views showing various shapes of wiring layers and light blocking layers on interposers in semiconductor packages formed according to any one of the first and second embodiments.

In FIG. 6A, two (upper left and upper right) corners among the four corners of the interposer are covered with light blocking layers 80b, and the remaining (lower left and lower right) corners are covered with conductors 50a of the wiring layer 50.

Figure 6B:
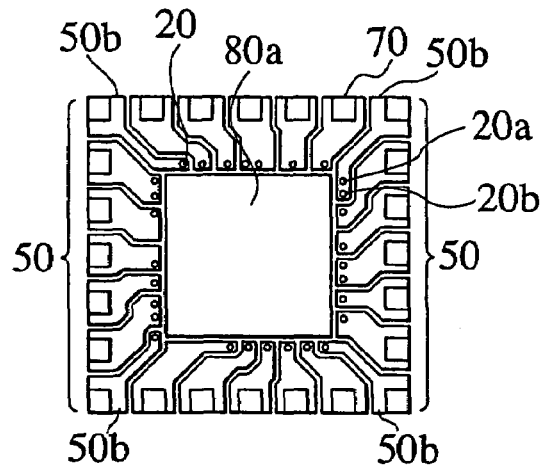

In FIG. 6B, the four corners of the interposer are covered with conductors 50b of the wiring layer 50.

Figure 6C:
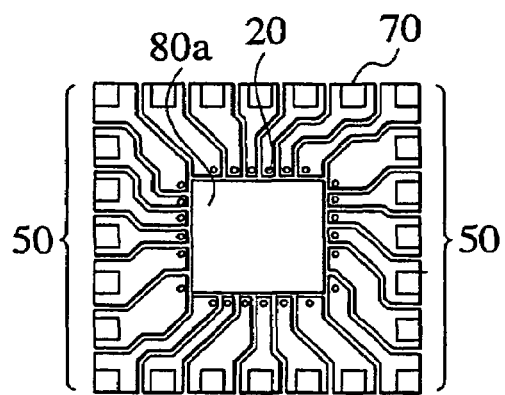

In FIG. 6C, the four corners of the interposer are covered with conductors of the wiring layer 50 like FIG. 6B. In FIG. 6B, some conductors (for example the upper right conductor 50b) are provided with a plurality of flip-chip contacts (20a, 20b). In FIG. 6C, no conductor is provided with a plurality of flip-chip contacts. In this way, some conductors of a wiring layer in a semiconductor package according to an embodiment of the present invention may each have two or more contacts connected to a semiconductor chip.

Figure 6D:
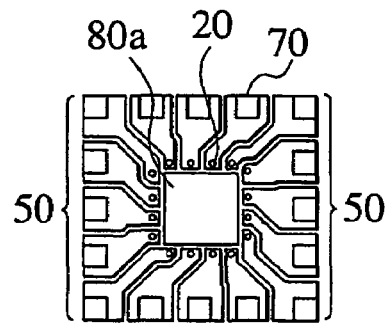

In FIG. 6D, each side of the interposer is provided with five external connection terminals 70. In FIGS. 6A to 6C, each side of the interposers are provided with seven external connection terminals 70. The number of external connection terminals 70 on a side of an interposer according to the present invention is optional and is not limited to 5 or 7.

Figure 6E:
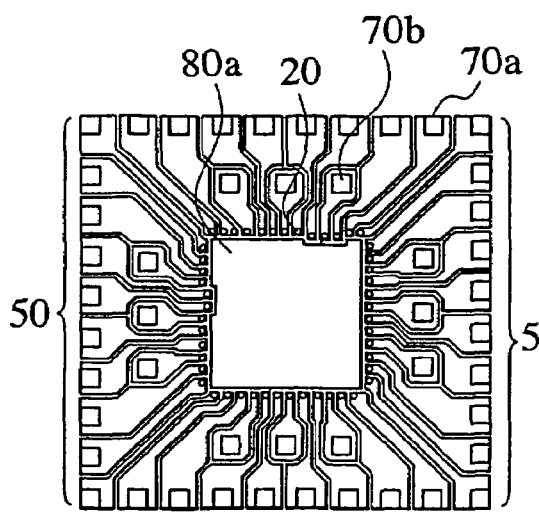
Figure 6F:
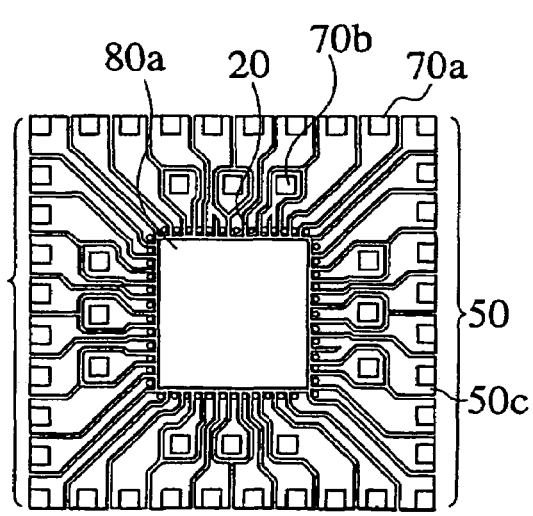

In FIGS. 6E and 6F, external connection terminals 70 are arranged along each edge of each interposer and at intermediate positions between the edges of the interposer and semiconductor chip. More precisely, the external connection terminals 70a are arranged along each edge of each interposer, and the external connection terminals 70b are arranged at intermediate positions between the edges of the interposer and the semiconductor chip.

In FIG. 6F, an end of a conductor (for example, 50c) at the edge of the semiconductor chip branches into two.

(Third Embodiment)

Figure 7:
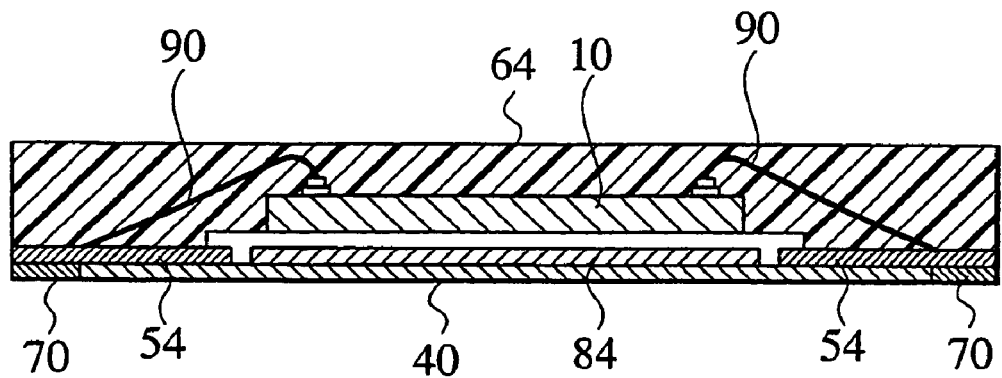
FIG. 7 is a sectional view showing a semiconductor package according to a third embodiment of the present invention.
Figure 8:
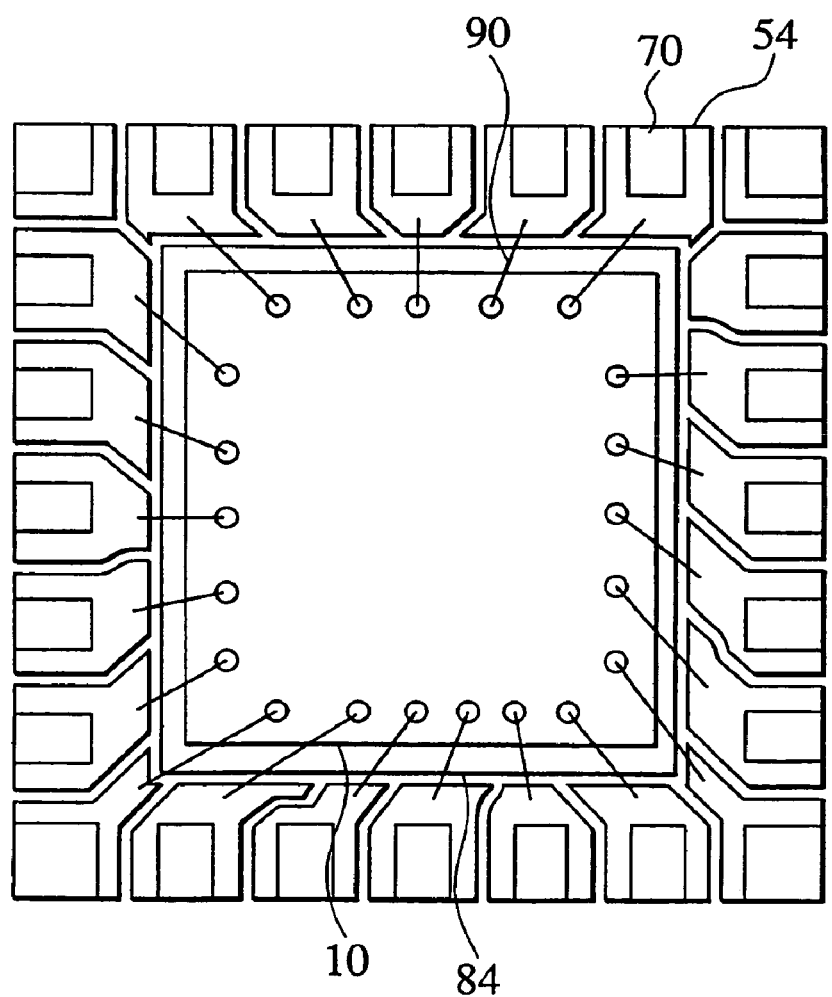
FIG. 8 is a plan view showing a wiring layer and light blocking layer formed on an interposer, a semiconductor chip, and metal wires in the package of FIG. 7.

As shown in FIGS. 7 and 8, the semiconductor package according to the third embodiment includes the interposer 40, the wiring layer 54 and the light blocking layer 84 formed on the interposer 40, the semiconductor chip 10, the metal wires 90 electrically connecting the semiconductor chip 10 to the wiring layer 54, and the resin mold 64 protecting the semiconductor chip 10, the wiring layer 54, and the metal wires 90.

Only differences in the third embodiment from the first embodiment will be explained. According to the third embodiment, the semiconductor chip 10 is mounted in a face-up position and is connected to the wiring layer 54 by the metal wires 90.

The light blocking layer 84 under the chip 10 is larger than the chip 10.

Compared with the first embodiment, the third embodiment further ensures the prevention of light passing through the interposer 40 from reaching the chip 10. If the light blocking layer 84 is smaller than the chip 10, light passing through gaps between the wiring layer 54 and the light blocking layer 84 may directly contact with the chip 10. According to the third embodiment, the light blocking layer 84 under the chip 10 is larger than the chip 10, and therefore, light passing through gaps between the wiring layer 54 and the light blocking layer 84 never directly reaches the chip 10 because the chip 10 is not present right above the gaps.

As in the first embodiment, the third embodiment adds light blocking components to the resin mold 64, to block light from passing through the resin mold 64 to the chip 10.

As explained above, the semiconductor package according to any one of the embodiments of the present invention minimizes the gaps between conductors of a wiring layer on the interposer of the package and arranges a light blocking layer in areas where the wiring layer is not present, to block light from passing through the interposer, thereby preventing leakage current from being generated by semiconductor elements in the package. This prevents malfunction and reduces power consumption of the package.

What is claimed is:

1. A semiconductor chip package comprising:
    a light-transmissive interposer having a no-wiring area and a predetermined area on a surface of the interposer;
    a wiring layer positioned over the interposer and substantially covering the predetermined area so as to prevent the transmission of natural light having predetermined wavelengths from passing through the predetermined area of the interposer, the wiring layer having a plurality of conductors having predetermined linewidths regularly spaced at an interval in a range of about 0.010 to 0.100 mm capable of preventing natural light from passing through the interval, each of the linewidths being wider than the interval;
    a semiconductor chip partially positioned over the no-wiring area and partially positioned over the predetermined area, and electrically connected to the wiring layer;
    a light blocking layer formed between the interposer and the semiconductor chip substantially covering all of the no-wiring area so as to block light passing through the no-wiring area of the interposer; and
    a resin mold covering a top side of the semiconductor chip and said chip package, wherein the interposer is a bottom layer of the semiconductor chip package.

2. The semiconductor package of claim 1, wherein the wiring layer and the light blocking layer are made of the same materials.

3. The semiconductor package of claim 1, wherein the light blocking layer is further formed at least at one of the corners of the interposer.

4. The semiconductor package of claim 1, wherein the resin mold contains at least one of carbon black powder and metal oxide powder.

5. The semiconductor package of claim 1, wherein:
    the semiconductor chip is mounted in a face-down configuration over the interposer; and
    a second light blocking layer is formed on a face of the semiconductor chip opposite to the interposer.

6. The semiconductor package of claim 1, wherein:
    the semiconductor chip is mounted in a face-up configuration on the interposer; and
    the light blocking layer is larger than the semiconductor chip.

7. The semiconductor package of claim 1, wherein contacts between the semiconductor chip and the wiring layer are sealed by an underfill material.

8. The semiconductor package of claim 1, wherein the interposer includes external connection terminals connected to the conductors of the wiring layer; the external connection terminals being arranged along the edge of the interposer and/or at intermediate positions between the edges of the interposer and the semiconductor chip.

9. The semiconductor package of claim 1, wherein at least one of the conductors of the wiring layer has at least two contacts in the vicinity of the semiconductor chip, these contacts being usable to connect the connector to the semiconductor chip.

10. The semiconductor package of claim 1, wherein at least one of the conductors of the wiring layer has an end branched into at least two sections, in the vicinity of the semiconductor chip.

11. The semiconductor chip package of claim 1, wherein end portions of the conductors align on a line along a side of the light blocking layer, and comprising a gap formed between each of the end portions and the side of the light blocking layer so as to prevent the transmission of the natural light.

* * * * *